(12) United States Patent
Cheng et al.

(10) Patent No.: US 9,263,284 B2
(45) Date of Patent: *Feb. 16, 2016

(54) LINE WIDTH ROUGHNESS IMPROVEMENT WITH NOBLE GAS PLASMA

(71) Applicant: Lam Research Corporation, Fremont, CA (US)

(72) Inventors: Shih-Yuan Cheng, Palo Alto, CA (US); Shenjian Liu, San Ramon, CA (US); Youn Gi Hong, Fremont, CA (US); Qian Fu, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/279,114

(22) Filed: May 15, 2014

(65) Prior Publication Data

US 2014/0248779 A1    Sep. 4, 2014

Related U.S. Application Data

(62) Division of application No. 12/921,753, filed as application No. PCT/US2009/034418 on Feb. 18, 2009, now Pat. No. 8,753,804.

(60) Provisional application No. 61/035,657, filed on Mar. 11, 2008.

(51) Int. Cl.
*H01L 21/3065* (2006.01)
*H01L 21/308* (2006.01)
*H01L 21/027* (2006.01)
*H01L 21/311* (2006.01)
*H01L 21/67* (2006.01)

(52) U.S. Cl.
CPC ........ *H01L 21/3065* (2013.01); *H01L 21/0271* (2013.01); *H01L 21/308* (2013.01); *H01L 21/31144* (2013.01); *H01L 21/67069* (2013.01)

(58) Field of Classification Search
CPC ............ H01L 21/0271; H01L 21/3065; H01L 21/308; H01L 21/31144
See application file for complete search history.

(56) References Cited

U.S. PATENT DOCUMENTS

| 7,160,671 | B2 | 1/2007 | Ko et al. |
| 2003/0003407 | A1 | 1/2003 | Ko et al. |
| 2006/0011469 | A1 | 1/2006 | Chen |
| 2006/0024968 | A1 | 2/2006 | Hudson et al. |

(Continued)

FOREIGN PATENT DOCUMENTS

| JP | 3440941 B2 | 6/2003 |
| KR | 10-2003-0092865 | 12/2003 |
| TW | 502300 | 9/2002 |

OTHER PUBLICATIONS

Notification of Examination Opinions dated Oct. 24, 2014 from Taiwanese Patent Application No. 98107859.

(Continued)

*Primary Examiner* — Brittany Raymond
(74) *Attorney, Agent, or Firm* — Beyer Law Group LLP

(57) ABSTRACT

A method for forming lines in an etch layer on a substrate may comprise providing a ultra-violet (UV) producing gas to a vacuum chamber having a photoresist mask, ionizing the UV producing gas to produce UV rays to irradiate the photoresist mask, and etching the lines into the etch layer through the photoresist mask.

15 Claims, 9 Drawing Sheets

(56) References Cited

U.S. PATENT DOCUMENTS

| | | |
|---|---|---|
| 2006/0166145 A1 | 7/2006 | Xiao et al. |
| 2007/0042607 A1 | 2/2007 | Sadjadi et al. |
| 2008/0136887 A1 | 6/2008 | Schmitt et al. |

OTHER PUBLICATIONS

Notification of Examination Opinions dated Apr. 27, 2015 from Taiwanese Patent Application No. 98107859.

International Search Report dated Aug. 31, 2009 from International Application No. PCT/US2009/034418.

Written Opinion dated Aug. 31, 2009 from International Application No. PCT/US2009/034418.

Notification of Examination Opinions dated Apr. 2, 2014 from Taiwan Application No. 098107859.

Notice of Allowance dated Feb. 3, 2014 from U.S. Appl. No. 12/921,753.

Office Action dated Mar. 15, 2014 from U.S. Appl. No. 12/921,753.

Office Action dated Nov. 1, 2013 from U.S. Appl. No. 12/921,753.

Office Action dated Aug. 15, 2013 from U.S. Appl. No. 12/921,753.

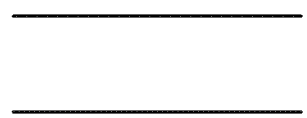
Low or No Line Width Roughness                FIG. 1A
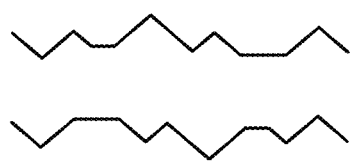
High Line Width Roughness                FIG. 1B
PRIOR ART

LINE WIDTH ROUGHNESS IMPROVEMENT WITH NOBLE GAS PLASMA

CROSS REFERENCE TO RELATED APPLICATIONS

This application is a Divisional of and claims benefit of priority to U.S. patent application Ser. No. 12/921,753 filed Dec. 22, 2010, which is a National Stage Entry of PCT/US09/34418 filed on Feb. 18, 2009, which claims priority from U.S. Provisional Application No. 61/035,657, all of which are incorporated herein by reference.

FIELD OF INVENTION

The present invention relates to etching an etch layer through a mask during the production of a semiconductor device. More specifically, the present invention relates to controlling the line width roughness (LWR) of fine features during the production of semiconductor devices.

BACKGROUND OF THE INVENTION

During semiconductor wafer processing, features of the semiconductor device are defined in the wafer using well-known patterning and etching processes. In these processes (photolithography), a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Typically, in photolithography steps, one or more antireflective coating (ARC) layers, for example, a bottom antireflective coating (BARC) and/or a dielectric antireflective coating (DARC) layer are provided under a photoresist mask. These layers minimize or eliminate reflections during exposure of the photoresist that may produce standing waves. Such standing waves may result in defects such as sinusoidal "scalloping" of the photoresist sidewalls, or the formation of "feet" at the base of the photoresist layer. Therefore, BARC/DARC layers are generally disposed below a photoresist layer and above other device materials (e.g. SiO2) to be etched through the photoresist mask. BARC/DARC layers may be organic-based or inorganic-based, and are usually composed of different materials than the underlying dielectric material. For example, an inorganic BARC layer may be composed of titanium nitride (TiN) as well as silicon oxynitride (SiON).

The critical dimension (CD) uniformity in ultra large scale integrated circuits (ULSI) is a crucial parameter for high performance devices. The CD uniformity in the gate electrode, for example, affects the threshold voltage distribution and the overall yield of the devices. As the design rules of ULSI reduced, the roughness of the edges of the lines (Line Width Roughness: LWR) of linear features patterned by photolithography becomes worse. The LWR is a measure of how smooth the edge of a linear feature is when viewed from the top down. The ideal feature has an edge that is "straight like a ruler" as shown in FIG. 1A. However, for various reasons the line feature may sometimes instead appear jagged as shown in FIG. 1B. Jagged lines (i.e., with a high LWR) are generally very undesirable because the CD measured along the liner feature would vary from position to position, rendering operation of the resulting device unreliable.

Argon-fluoride (ArF) excimer laser having wavelength of 193 nm (ArF lithography technology) has been used to for the production of sub 0.04 µm devices. The immersion 193 nm lithography technology enables processes below the 110 nm node. Such small features in most highly integrated circuits require higher resolution and the CD uniformity. Accordingly, the LWR problem worsens in the 193 nm lithography technology.

SUMMARY OF THE INVENTION

In one embodiment, a method for forming lines in an etch layer on a substrate may comprise providing a high-intensity vacuum ultra-violet (VUV) producing gas to a vacuum chamber having a photoresist mask, ionizing the VUV producing gas to produce VUV rays to irradiate the photoresist mask, and etching the lines into the etch layer through the photoresist mask.

In another embodiment, a method for etching lines on a wafer may comprise providing a noble gas plasma to a vacuum chamber having a photoresist mask on the wafer, ionizing the noble gas plasma to produce VUV rays, irradiating the wafer with the VUV rays, whereby the VUV rays cause the photoresist mask to be altered such that line width roughness (LWR) is reduced, and etching features into the wafer through the altered photoresist mask.

In yet another embodiment, a method for forming lines on a substrate may comprise, forming a photoresist mask having a plurality of patterned lines, exposing an argon plasma to the photoresist mask, and etching the lines into the substrate through the photoresist mask.

In still yet another embodiment, an apparatus for forming lines on a substrate may have a plasma processing chamber. The plasma processing chamber includes a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, at least one RF power source electrically connected to the at least one electrode, a gas inlet for providing gas into the plasma processing chamber enclosure, and a gas outlet for exhausting gas from the plasma processing chamber enclosure. The plasma processing chamber further includes a gas source and a controller. The gas source is in fluid connection with the gas inlet, and includes a noble gas source and an etch gas source. The controller is controllably connected to the gas source and the at least one RF power source, and includes at least one processor and computer readable media. The computer readable media may include computer readable code for providing a noble gas source, computer readable code for forming a noble gas plasma from the noble gas source, computer readable code for ionizing the noble gas source to form vacuum ultra-violet (VUV) rays, computer readable code for irradiating the substrate with the VUV rays, and computer readable code for stopping the flow of the noble gas. The computer readable code for etching features into the etch layer through the substrate computer readable code for providing an etch gas from the etch gas source, computer readable code for forming a plasma from the etch gas, and computer readable code for stopping the etch gas. The computer readable media further includes computer readable code for removing the patterned mask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 1A-B are schematic diagram for explaining line width roughness.

DETAILED DESCRIPTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 2A:
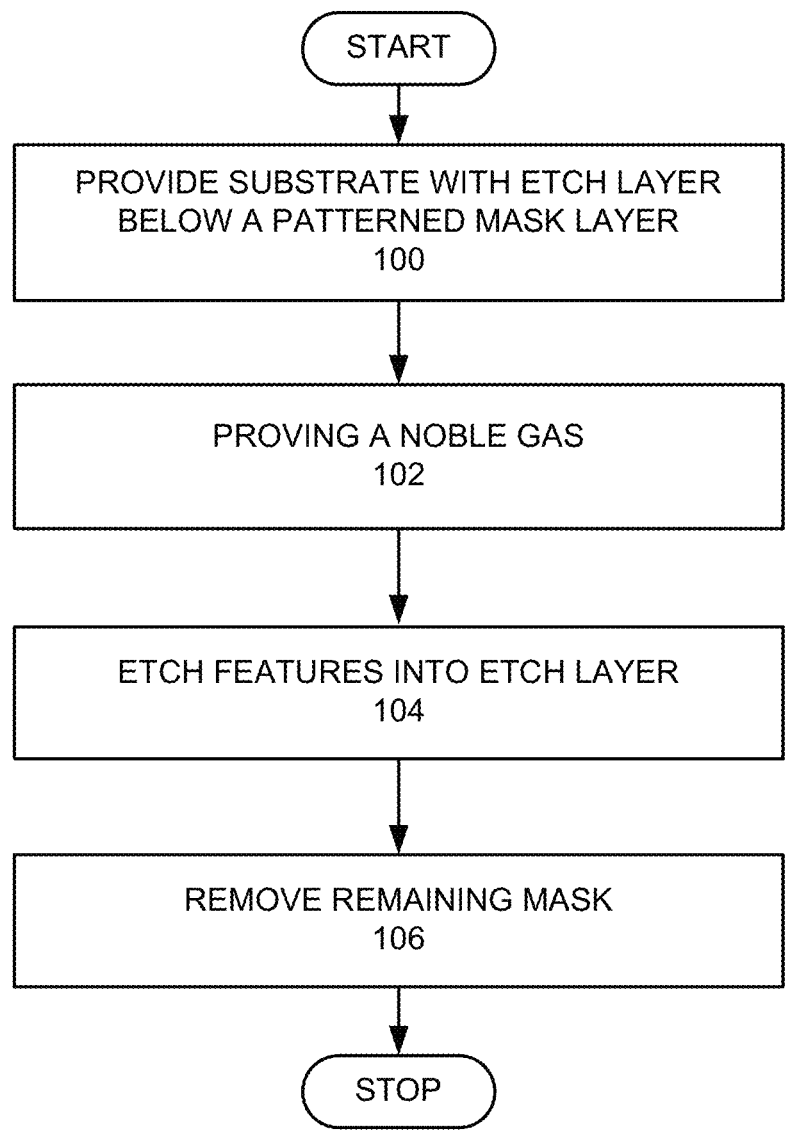
FIG. 2A is a high-level flow chart for forming lines in a substrate.
Figure 3:
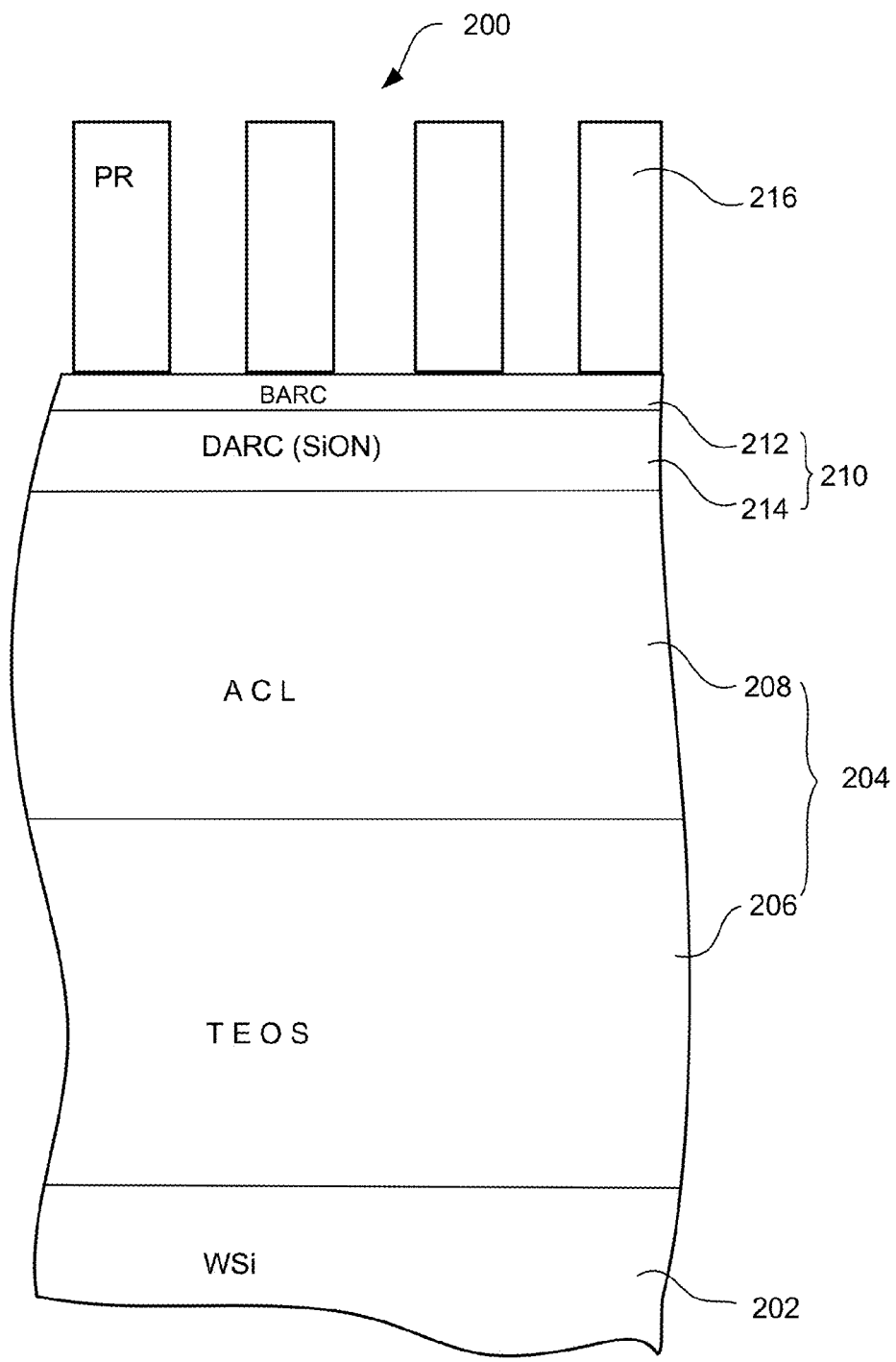
FIG. 3 is an exemplary schematic cross-sectional view of a stack of layers formed on a substrate.

To facilitate understanding, FIG. 2A is a high-level flow chart for forming lines in a substrate. A substrate with an etch layer disposed below a patterned mask is provided (step 100). To facilitate understanding of the invention, FIG. 3 is a schematic cross-sectional view of a stack 200 of layers formed on a substrate 202, including an etch layer 204 disposed below an ARC layer 210 below the patterned mask 216. The patterned mask 216 may be a photoresist (PR) mask. In this example, the mask 216 is a PR mask having a line-space pattern to form a plurality of lines and spaces in the etch layer. The PR mask 216 may be patterned with the immersion 193 nm photolithography having a CD about 40 nm.

As shown in FIG. 3, the etch layer 204 may include a dielectric layer 206 and an amorphous carbon layer (ACL) 208. The dielectric layer 206 may be made of a silicon oxide based dielectric material such as $SiO_2$, silicon nitride (SiN), or tetora-ethyl-ortho-silicate (TEOS). Amorphous carbon is similar to a polymer, but with less hydrogen and more carbon since it is deposited at high temperature greater than 200 C by CVD, and thus it is more etch resistant than polymer.

In one embodiment, and as illustrated in FIG. 3, the ARC layer 210 may include a bottom antireflective coating (BARC) layer 212 formed blow the PR mask 216, and a dielectric antireflective coating (DARC) layer 214 below the BARC layer 212. These layers minimize or eliminate reflections during exposure of the photoresist. Although illustrated with the BARC and DARC layers, all layers are not necessary. Furthermore, the substrate may not have an ARC layer 210.

The BARC/DARC layers may be organic-based or inorganic-based, and are usually composed of different materials than the underlying dielectric material. For example, when the BARC layer 212 is carbon-based organic layer, and the upper etch layer (the ACL 208 in this example) is also carbon-based material, an inorganic BARC layer, such as silicon oxynitride (SiON), will prevent the etch layer from undesirably being etched during an ARC layer opening process. In a specific example, the stack 200 may have the PR mask 216 with a thickness of about 100 nm, the BARC layer 212 with a thickness of about 20 nm, the DARC layer 214 with a thickness of about 40 nm, the ACL layer 208 with a thickness of about 220 nm, and the dielectric (such as TEOS or PE-TEOS) layer 206 with a thickness of about 210 nm. This structure may be suitable for gate electrodes in semiconductor devices. In this example, the target feature in the dielectric layer 206 may have a high aspect ratio that is 5:1 or greater, preferably 10:1 or greater.

Figure 6:
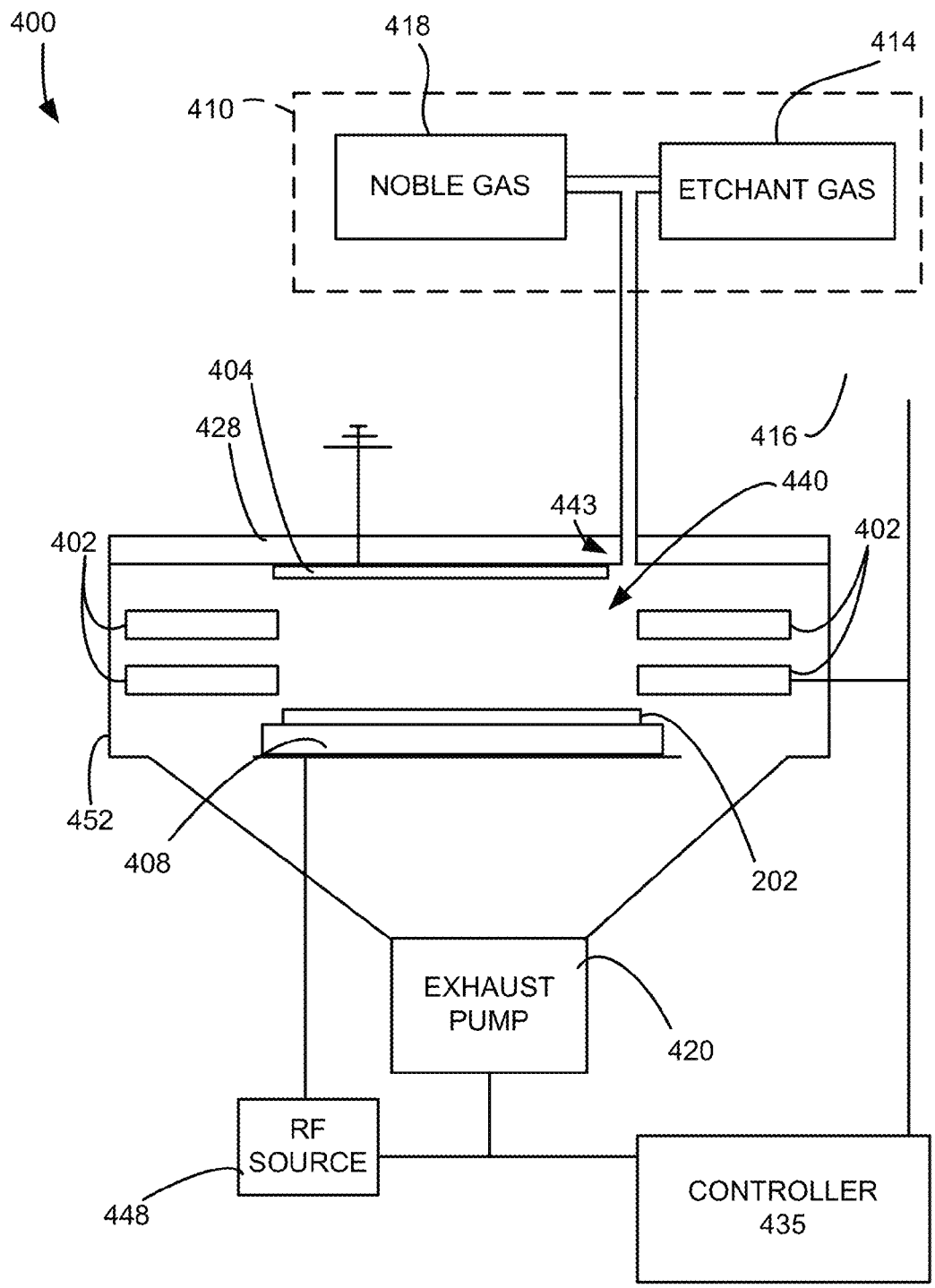
FIG. 6 is a schematic view of an exemplary plasma processing chamber.

Referring back to FIG. 2A, an ultra-violet (UV) producing or noble gas may be provided in a vacuum chamber (step 102) as further described in FIG. 6. The noble gas may be any gas containing a noble gas element such argon, helium, xenon, and any other noble gas. In one embodiment, the noble gas comprises argon. The noble gas may have about between about 40%-100% argon.

Figure 2B:
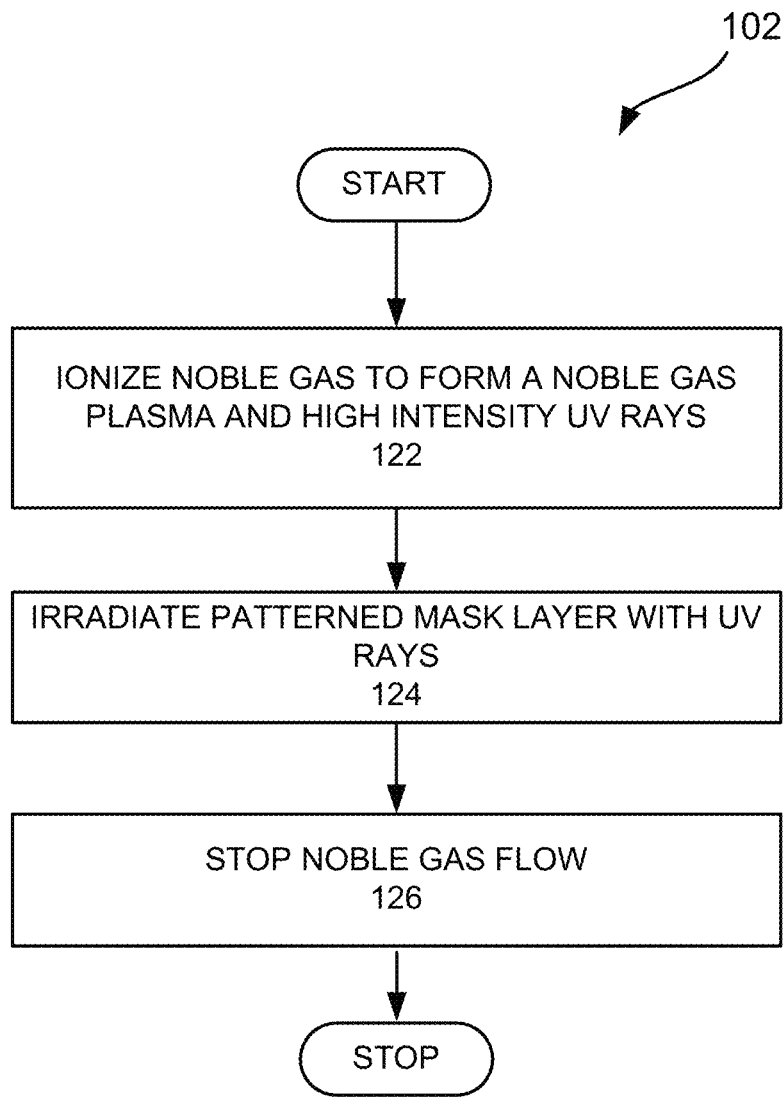
FIG. 2B is a detailed flow chart for providing a noble gas plasma.

FIG. 2B is a detailed flow chart for providing a noble gas, which may be performed using a vacuum plasma processing chamber 400 described below with reference to FIG. 6. The substrate 202 having the stack 200 is provided in the plasma processing chamber 400. Prior to providing the noble gas, the patterning of the mask 216 may also be performed in the same processing chamber 400. In the providing the noble gas process (step 102), the noble gas may be ionized to form UV and/or vacuum UV (VUV) rays. Since a vacuum chamber is used, the UV rays may contain high intensity VUV rays. The high intensity VUV radiation unexpectedly marked significant difference from using typical atmospherical UV treatment as described with reference to FIG. 5C. Additionally, although no bias is applied to the noble gas, the plasma formed from the noble gas may produce a bias that may be less than 30 volts.

The patterned mask may be exposed to and irradiated by the UV and/or VUV rays (step 124). Not intended to be limited to the following reason, it is believed that the irradiation of the high intensity UV rays alters the mask. The UV rays may break down the molecular bonds of resist surface structure of the mask. This may cause the mask to further cross-link thereby smoothening and shrinking the volume of the mask. It is believed that this smoothening and shrinking reduces the LWR of the etched features of the substrate.

An example recipe for forming the lines in the substrate may have a pressure in the plasma chamber set at 30 mTorr, and the noble gas plasma including argon, and 1000 Watts of plasma generating power.

After irradiating the mask layer, the noble gas flow is stopped so as to stop the plasma (step 126). Referring back to FIG. 2A, features may be etched into the etch layer 202 (step 104) using the same plasma processing chamber 400 that used for providing the noble gas plasma and exposing the mask to the noble gas plasma. Thus, any remaining mask may be removed (step 106) by an ashing process or the like.

Figure 4:
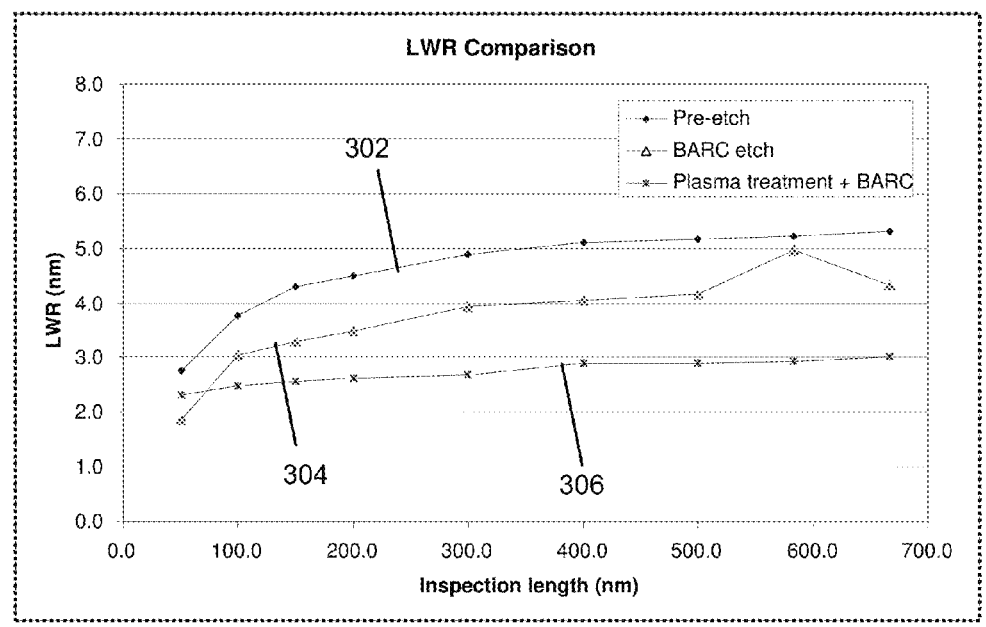
FIG. 4 is a chart comparing LWR using argon gas.

FIG. 4 is a chart comparing LWR using argon gas. The first condition 302 shows the LWR before the substrate is etched, the substrate is without a BARC layer, and the substrate is not exposed to the argon gas plasma. It was determined that the LWR was about 5.3 nm. In the second condition 304, the substrate is provided with a BARC layer but not exposed to the argon gas plasma. It was determined that the LWR was about 4.3 nm. Lastly, in the final condition 304, the substrate is provided with a BARC layer and is exposed to the argon gas plasma. It was unexpectedly determined that the LWR was about 3.0 nm. This illustrates that exposure of the substrate to the argon gas plasma was able to reduce LWR of the etched features of the substrate.

Figure 5A:
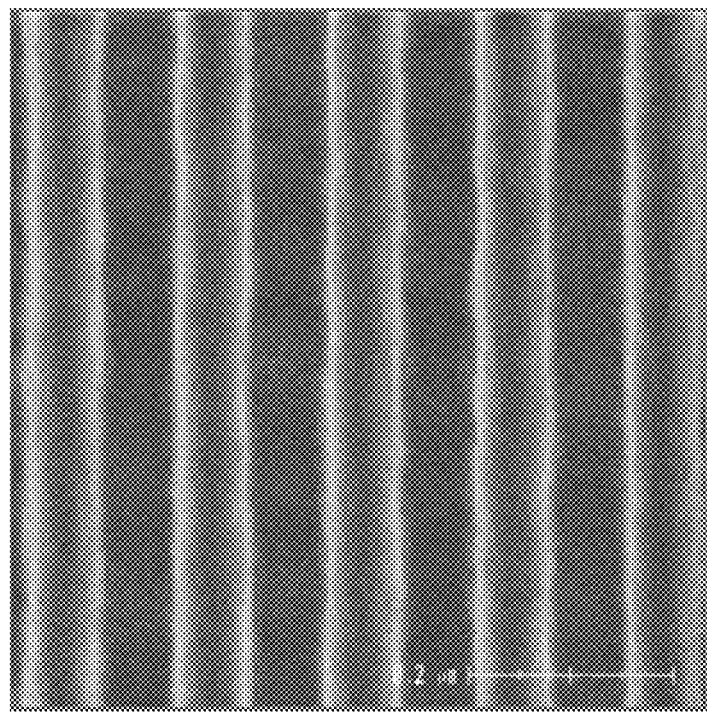
FIGS. 5A-5C illustrate top down SEM pictures comparing LWR using argon gas.
Figure 5B:
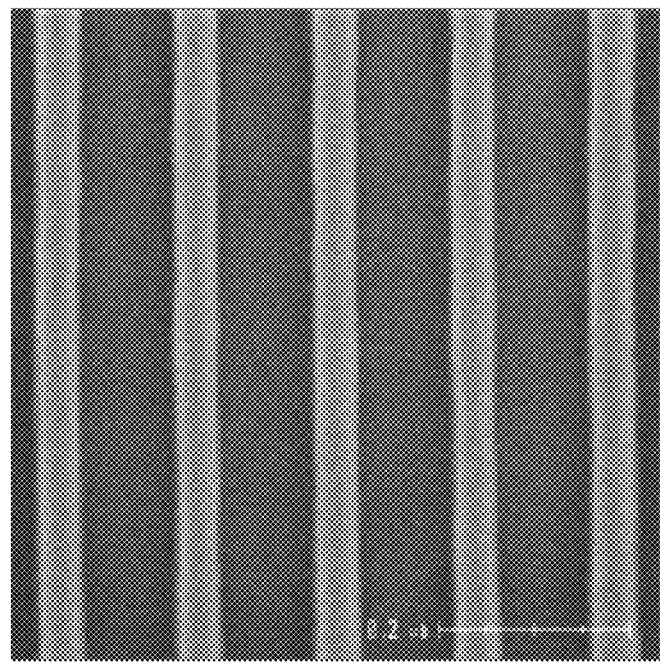
Figure 5C:
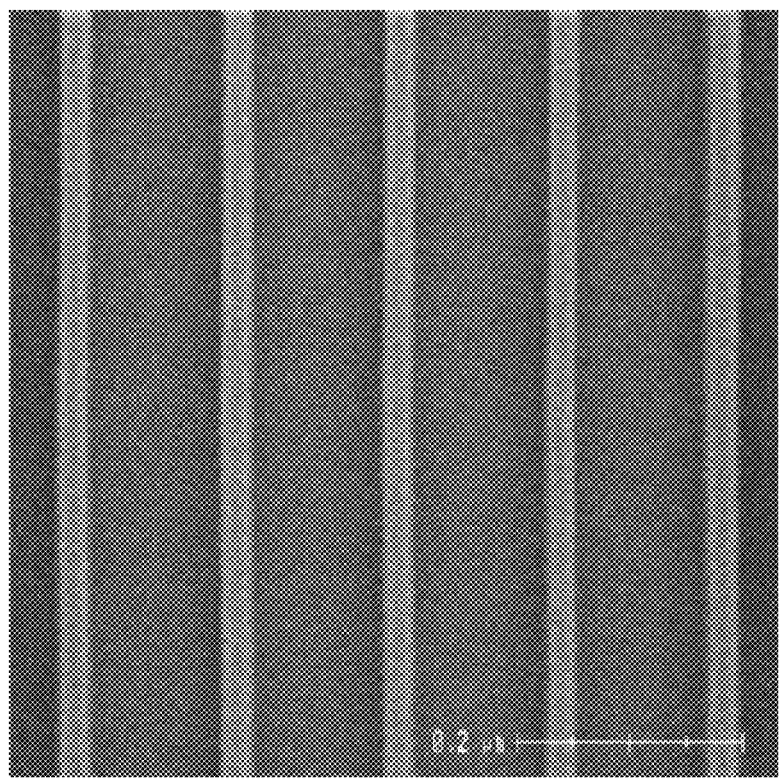

FIGS. 5A-5B illustrate top down SEM pictures comparing LWR using argon gas. FIG. 5A illustrates the first condition 302 illustrated in FIG. 4, whereby the substrate is not etched yet, and the substrate is not exposed to the argon gas plasma. As illustrated, the LWR is high. FIG. 5B illustrates the second condition 304 illustrated in FIG. 4, whereby the BARC layer is etched but not exposed to the argon gas plasma. Although LWR is reduced, it still worsens in the 193 nm lithography technology. FIG. 5C illustrates the third condition 306 illustrated in FIG. 4, whereby the BARC layer is etched and the substrate is exposed to the argon gas plasma. As illustrated, when the line width (LW) of the line (the width of the dielectric layer 206) along the etched line features is measured after exposure to the noble gas plasma, the LWR is improved (i.e., reduced) to about 3.0 nm.

FIG. 6 is a schematic view of a plasma processing chamber 400 that may be used for inventive etching. The plasma processing chamber 400 comprises confinement rings 402, an upper electrode 404, a lower electrode 408, a gas source 410, and an exhaust pump 420 connected to a gas outlet. Within plasma processing chamber 400, the substrate 202 (with the stack of layers) is positioned upon the lower electrode 408. The lower electrode 408 incorporates a suitable substrate chucking mechanism (e.g., electrostatic, mechanical clamping, or the like) for holding the substrate 202. The reactor top 428 incorporates the upper electrode 404 disposed immediately opposite the lower electrode 408. The upper electrode 404, lower electrode 408, and confinement rings 402 define the confined plasma volume. Gas is supplied to the confined plasma volume by the gas source 410 and is exhausted from the confined plasma volume through the confinement rings 402 and an exhaust port by the exhaust pump 420. Besides helping to exhaust the gas, the exhaust pump 420 helps to regulate pressure. In this embodiment, the gas source 410 may comprise a noble gas source 418. The gas source 410 may further comprise other gas sources, such as an etching gas source 414 for the subsequent etch processes for the etch layer to be performed in the processing chamber 400.

As shown in FIG. 6, an RF source 448 is electrically connected to the lower electrode 408. Chamber walls 452 surround the confinement rings 402, the upper electrode 404, and the lower electrode 408. The RF source 448 may comprise a 2 MHz power source, a 60 MHz power source, and a 27 MHz power source. Different combinations of connecting RF power to the electrode are possible. In the case of Lam Research Corporation's Dielectric Etch Systems such as Exelan® Series, made by LAM Research Corporation™ of Fremont, Calif., which may be used in a preferred embodiment of the invention, the 27 MHz, 2 MHz, and 60 MHz power sources make up the RF power source 448 connected to the lower electrode, and the upper electrode is grounded. A controller 435 is controllably connected to the RF source 448, exhaust pump 420, and the gas source 410.

Figure 7A:
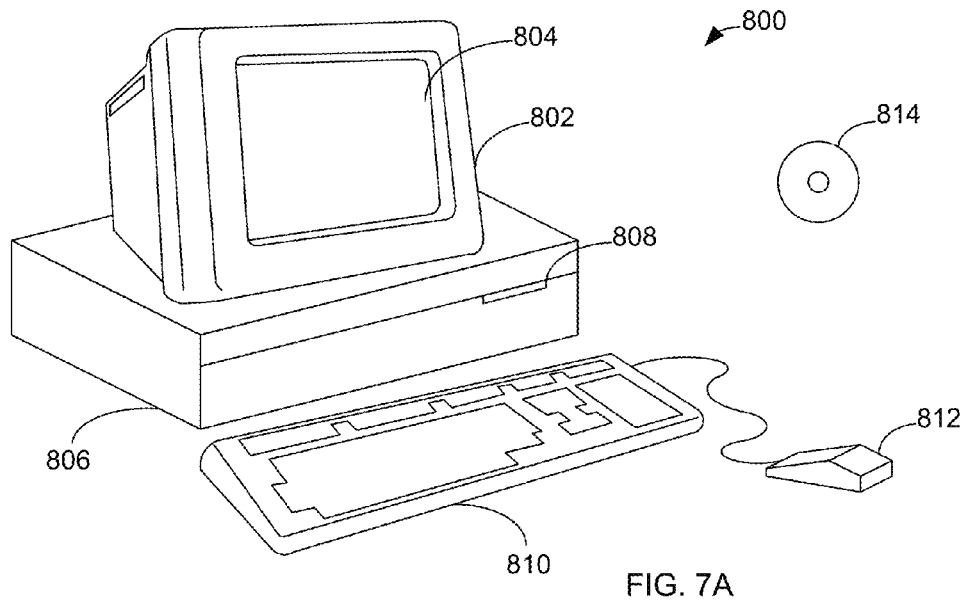
FIGS. 7A-B illustrate a computer system, which is suitable for implementing a controller used in embodiments of the present invention.
Figure 7B:
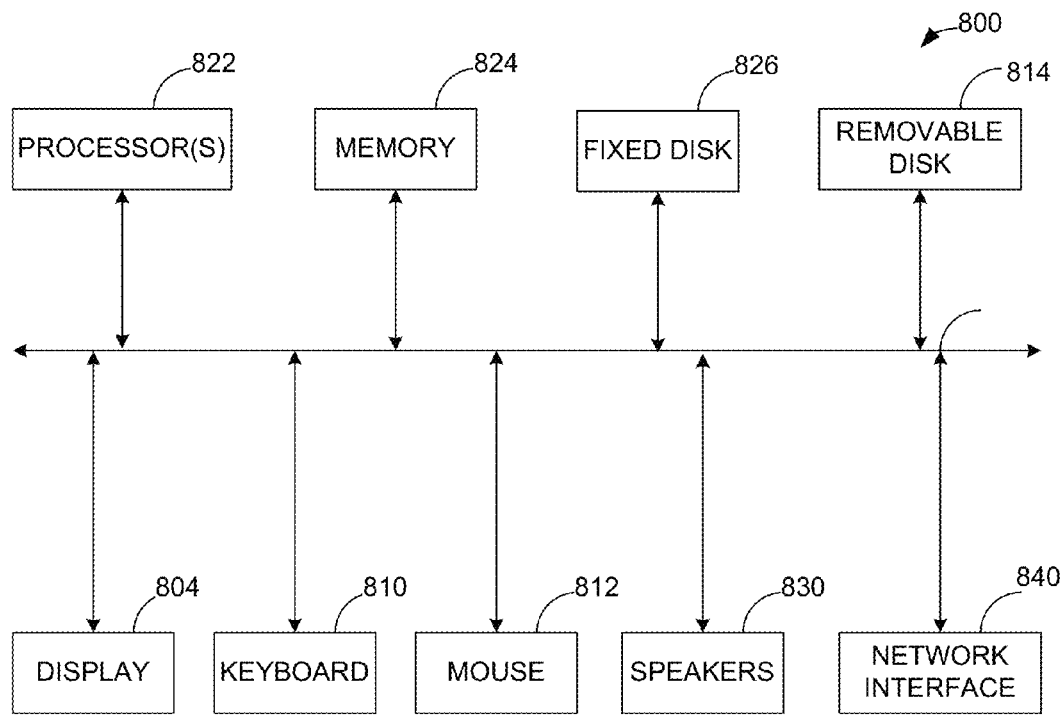

FIGS. 7A and 7B illustrate a computer system 800, which is suitable for implementing a controller 435 used in embodiments of the present invention. FIG. 7A shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 7B is an example of a block diagram for computer system 800. Attached to system bus 820 are a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of the computer-readable media described below.

CPU 822 is also coupled to a variety of input/output devices, such as display 804, keyboard 810, mouse 812, and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for forming lines in an etch layer on a substrate, comprising:
    placing the substrate into a vacuum chamber;
    forming a photoresist mask having a plurality of patterned lines over the etch layer;
    providing a high-intensity vacuum ultra-violet (VUV) producing gas comprising argon gas into the vacuum chamber;
    ionizing the argon gas to produce VUV rays to irradiate the photoresist mask; and
    etching the lines into the etch layer through the photoresist mask.

2. The method of claim 1, wherein the VUV producing gas has at least 40% argon.

3. The method of claim 1, wherein the argon gas forms a plasma.

4. The method of claim 3, wherein the plasma formed from argon produces a bias.

5. The method of claim 4, wherein the ionizing and etching occur in the vacuum chamber.

6. The method of claim 1, wherein the ionizing and etching occur in the vacuum chamber.

7. The method of claim 1, wherein the ionizing comprises producing a bias of less than 30 volts.

8. The method of claim 1, wherein the providing, ionizing and etching occurs in the vacuum chamber.

9. The method of claim 1, wherein the ionizing the argon gas to produce VUV rays to irradiate the photoresist mask reduces line width roughness (LWR) of the patterned lines of the substrate.

10. A method for forming lines in an etch layer on a substrate and disposed below a photoresist mask, comprising:
    placing the substrate in a vacuum chamber;
    providing an argon gas plasma to the vacuum chamber;
    ionizing the argon gas plasma to produce VUV rays;
    irradiating the photoresist mask with the VUV rays, whereby the VUV rays cause the photoresist mask to be altered such that line width roughness (LWR) is reduced; and
    etching lines into the etch layer through the altered photoresist mask.

11. The method of claim 10, wherein the providing, ionizing, irradiating, and etching occurs in the vacuum chamber.

12. The method of claim 10, wherein the argon gas plasma is at least 40% argon.

13. The method of claim 10, wherein the argon gas plasma produces a bias.

14. The method of claim 10, wherein the ionizing and etching occur in the vacuum chamber.

15. The method of claim 10, wherein the ionizing comprises producing a bias of less than 30 volts.

* * * * *